US006828809B1

(12) United States Patent
Bruce et al.

(10) Patent No.: US 6,828,809 B1
(45) Date of Patent: Dec. 7, 2004

(54) PHOTON DETECTION ENHANCEMENT OF SUPERCONDUCTING HOT-ELECTRON PHOTODETECTORS

(75) Inventors: Michael R. Bruce, Austin, TX (US); Robert Powell, Austin, TX (US); Brennan Davis, Austin, TX (US); Rama Goruganthu, Austin, TX (US); Thomas Chu, Austin, TX (US); Miguel Santana, Jr., Buda, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 79 days.

(21) Appl. No.: 10/324,324

(22) Filed: Dec. 20, 2002

(51) Int. Cl.[7] .............................................. G01R 31/302

(52) U.S. Cl. ...................... 324/752; 324/751; 250/559.4

(58) Field of Search ................................. 324/750, 751, 324/752, 753, 765, 158.1; 250/559.4, 559.44, 559.22; 328/145, 149

(56) References Cited

U.S. PATENT DOCUMENTS

| 4,270,046 | A |   | 5/1981  | Werking ...................... 250/205 |
| 4,761,607 | A | * | 8/1988  | Shiragasawa et al. ....... 324/752 |
| 5,412,328 | A |   | 5/1995  | Male et al. .................. 324/752 |
| 5,940,545 | A | * | 8/1999  | Kash et al. .................. 382/312 |
| 6,596,980 | B2|   | 7/2003  | Rusu et al. .............. 250/214.1 |
| 6,657,446 | B1| * | 12/2003 | Goruganthu et al. ........ 324/752 |

OTHER PUBLICATIONS

M. Lanzoi et al.; *Extended Hot–Carrier Induced Photon Emission In n–Channel MOSFETS;* IEEE; 1990; pp. 69–72.
M. Ghioni et al.; *All–Silicon Avalanche Photodiode Sensitive at 1.3 μm with Picosecond Time Resolution;* IEEE Journal of Quantum Electronics, Vol. 28, No. 12; Dec. 1992; pp. 2678–2681.

Andrea L. Lacaita et al.; *On the Bremsstrahlung Origin of Hot–Carrier–Induced Photons in Silicon Devices;* IEEE Transactions on Electron Devices, Vol. 40, No. 3; Mar. 1993; pp. 577–582.

Andrea Lacaita et al.; *Single–Photon Avalanche Diode with Ultrafast Pulse Response Free from Slow Tails;* IEEE Electron Device Letters, Vol. 14, No. 7; Jul. 1993; pp. 360–362.

Luca Selmi et al.; *A Comparative Study Of Hot–Carrier Induced Light Emission And Degradation In Bulk And SOI MOSFETs;* IEEE; 1995; pp. 49–52.

J. C. Tsang et al.; *Picosecond hot electron light emission from submicron complementary–metal–oxide–semiconductor circuits;* Applied Physics Letters, Vol. 70, Issue 7; Feb. 17, 1997; pp. 889–891.

J. A. Kash et al.; *Dynamic Internal Testing of CMOS Circuits Using Hot Luminescence;* IEEE Electron Device Letters, Vol. 18, No. 7; Jul. 1997; pp. 330–332.

(List continued on next page.)

*Primary Examiner*—David A. Zarneke
*Assistant Examiner*—Tung X. Nguyen
(74) *Attorney, Agent, or Firm*—Timothy M. Honeycut

(57) ABSTRACT

Various methods of hot-electron imaging a workpiece are provided. In one aspect, a method of examining a workpiece is provided that includes directing a first photon at a photodetector at a first known time and stimulating a circuit device of the workpiece at a second known time to produce a condition in the circuit device conducive to photon emission. At least one photon emitted by the circuit device in response to the stimulation is detected. The first photon increases the quantum efficiency of the photodetector in detecting the at least one photon. The detection of the at least one photon relative to the first known time and the second known time is time correlated to temporally distinguish the first photon and the at least one photon and to temporally correlate the stimulation of the circuit device to the detection of the at least one photon.

28 Claims, 2 Drawing Sheets

OTHER PUBLICATIONS

Alessandro Spinelli et al.; *Avalanche Detector with Ultra-clean Response for Time–Resolved Photon Counting;* IEEE Journal of Quantum Electronics, Vol. 34, No. 5; May 1998; pp. 817–821.

K. S. Il'in et al.; *Ultimate quantum efficiency of a superconducting hot–electron photodetector;* Applied Physics Letters, Vol. 73, No. 26; Dec. 28, 1998; pp. 3938–3940.

J. A. Kash et al.; *Backside Optical Emission Diagnostics for Excess $I_{DDQ}$;* IEEE Journal of Solid–State Circuits, Vol. 33, No. 3; Mar. 1998; pp. 508–511.

Dan Knebel et al.; *Diagnosis and Characterization of Timing–Related Defects by Time–Dependent Light Emission;* IEEE, 1998; pp. 733–739.

P. N. Sanda et al.; *Picosecond Imaging Circuit Analysis of the POWER3 Clock Distribution;* IEEE International Solid–State Circuits Conference, Feb. 1999; pp. 372–373.

F. Stellari et al.; *Tools for Non–Invasive Optical Characterization of CMOS Circuits;* IEEE; 1999; pp. 487–490.

K. S. Il'in et al.; *Picosecond hot–electron energy relaxation in NbN superconducting photodetectors;* Applied Physics Letters, Vol. 76, No. 19; May 8, 2000; pp. 2752–2754.

Franco Zappa et al.; *High–Sensitivity Photodetectors with On–Chip Pinhole for Laser Scanning Microscopy;* IEEE Transactions on Electron Devices, Vol. 47, No. 7; Jul. 2000; pp. 1472–1476.

J. C. Tsang et al.; *Picosecond imaging circuit analysis;* IBM J. Res Develop., Vol. 44, No. 4; Jul. 4, 2000; pp. 583–603.

Franco Zappa et al.; *An Integrated Active–Quenching Circuit for Single–Photon Avalanche Diodes;* IEEE Transactions on Instrumentation and Measurement, Vol 49, No. 6; Dec. 2000; pp. 1167–1175.

L. Duraffourg et al.; *Photon counting in the 1540–nm Wavelength Region with a Germanium Avalanche Photodiode;* IEEE Journal of Quantum Electronics, Vol. 37, No. 1; Jan. 2001; pp. 75–79.

G. Gol'tsman; *Fabrication and Properties of an Ultrafast NbN Hot–electron Single Photon Detector;* IEEE Transactions on Applied Superconductivity, Vol. 11, No. 1; Mar. 2001; pp. 574–577.

A. D. Seminov et al.; *Hot–Electron Effect in Superconductors and Its Applications for Radiation Sensors*–University of Rochester Laboratory for Laser Energetics Review, Vol. 87; Jun. 2001; pp. 134–152.

Peter Weiss; *Little lamp may set quantum tech aglow; htt://www.phschool.com/science/science_news/articles/little_lamp_quantum.html;* Dec. 15, 2001; pp. 1–2.

Eric Smalley: *LED fires one photon at a time;* Technology Research News;*Http://www.tmmag.com/Stories/2001/121901/LED_fires_one_photon_at_a_time_121901.html;* Dec. 15, 2001; pp. 1–3.

Massimo Ghioni et al.; *Monolithic Dual–Detector for Photon–Correlation Spectroscopy With Wide Dynamic Range and 70–ps Resolution;* IEEE Journal of Quantum Electronics, Vol. 37, No. 12; Dec. 2001; pp. 1588–1593.

Franco Stellari et al.; *High–Speed CMOS Circuit Testing by 50 ps Time–Resolved Luminescence Measurements;* IEEE Transactions on Electron Devices, Vol. 48, No. 12; Dec. 2001; pp. 2830–2835.

Zhitiang Yuan et al.; *Electrically Driven Single–Photon Source; www.sciencemag.org;* Dec. 13, 2001; pp. 102–105.

Daniel S. Burgess; *Quantum Dots Offer Single Photons;* Photonics Technology News; *www.photonics.com;* Apr. 2002; pp. 1–2.

Semiconductorfabtech.com; Semiconductorfabtech.com; *http://www.semiconductorfabtech.com/features/tap/industry.news/2001/06/20.02.shtml;* Nov. 6, 2002; pp. all Mike Bruce et al.; *Single Point PICA Probing with an Avalanche Photo–Diode;* 27th ISTFA; Nov. 2001; pp. 23–29.

* cited by examiner

PHOTON DETECTION ENHANCEMENT OF SUPERCONDUCTING HOT-ELECTRON PHOTODETECTORS

BACKGROUND OF THE INVENTION

1. Field of the Invention

This invention relates generally to semiconductor processing, and more particularly to methods of probing a workpiece using hot-electron induced photon emission.

2. Description of the Related Art

Fault-isolation techniques are critical to the development and manufacture of large-scale integrated circuits such as microprocessors. As the numbers of devices per integrated circuit have continued to climb and the sizes of those devices continued to shrink, methods have been developed to probe the operation of integrated circuits at the device level.

Electron beam micro probing has been used for a number of years as a means of analyzing electrical wave forms generated by the various microscopic circuit structures in an integrated circuit. An electron beam ("e-beam") micro probe is a particularized type of electron microscope that is designed to provide a visual image of the circuit structures on an integrated circuit. E-beams are specifically focused at targeted circuit structures on the integrated circuit and the reaction of the circuit structures to the directed e-beams are sensed by the microscope. Actual electrical test patterns can be used to stimulate the integrated circuit in various ways during the scanning. This is normally accomplished by mounting an integrated circuit on a test board. As with other types of electron microscopy, high vacuum conditions are required for e-beam micro probing.

One method proposed for providing improved waveform probing over conventional electron beam probing has been coined Picosecond Imaging Circuit Analysis or PICA for short. PICA measures time-dependent hot carrier induced light emission from an integrated circuit (IC) both spatially and temporally, thus enabling failure analysis and timing evaluation of a device. Hot electron light emission is generated as a short duration pulse coincident with the normal logic state switching of MOS circuits. This emission can be readily observed and used to directly measure the propagation of high-speed signals through the individual gates. The technique is useful in that non-invasive diagnostics of fully functional MOS devices may be performed.

In one conventional PICA approach, an imaging microchannel plate photo-multiplier tube (MCP-PMT) is used to detect to the photons. Within the field of view of the objective, the technique allows for parallel acquisition of time resolved emission from many nodes at once. Unfortunately, a typical conventional MCP-PMT detector has low quantum efficiency, especially in the near infrared region. In particular, the detector loses virtually all sensitivity for wavelengths above 900 nm. For acquisition of photon emission from the backside of silicon substrates, this has proved problematic. As a result of the spectral characteristics of hot carrier emission and the optical transmission characteristics of doped silicon, most backside transmitted photons will be in the 900 to 1,500 nm range. Thus, the typical MCP-PMT will detect few of the available photons. This can lead to lengthy acquisition times.

Superconducting hot-electron photodetectors ("SHEP") are being proposed as another type of photodetector for hot-electron emission probing of integrated circuits, whether by PICA or other technique. Conventional SHEPs are operated in a resistive mode. When a hot-electron emission photon is absorbed, the superconducting state of the SHEP is temporarily halted, at least in a localized area This loss of superconductivity is sensed as a sudden increase in resistivity. The departure from a superconductive state is thought to be the result of the breaking of Cooper pairs within the lattice of the SHEP.

Conventional SHEPs can exhibit a limited quantum efficiency. The fallout of limited quantum efficiency is the possibility of the SHEP not detecting certain circuit switching events. A missed switching event may be inadvertently interpreted as a fault in the circuit device rather than a missed photon event. To be able to distinguish the difference with confidence, the testing engineer will need to test the circuit element for time periods sufficient to make up for the lack of quantum efficiency. This may entail long testing periods.

The present invention is directed to overcoming or reducing the effects of one or more of the foregoing disadvantages.

SUMMARY OF THE INVENTION

In accordance with one aspect of the present invention, a method of examining a workpiece is provided that includes directing a first photon at a photodetector at a first known time and stimulating a circuit device of the workpiece at a second known time to produce a condition in the circuit device conducive to photon emission. At least one photon emitted by the circuit device in response to the stimulation is detected. The first photon increases the quantum efficiency of the photodetector in detecting the at least one photon. The detection of the at least one photon relative to the first known time and the second known time is time correlated to temporally distinguish the first photon and the at least one photon and to temporally correlate the stimulation of the circuit device to the detection of the at least one photon.

In accordance with another aspect of the present invention, a method of examining a workpiece is provided that includes directing a first photon at a superconducting hot-electron photodetector at a first known time and stimulating a circuit device of the workpiece at a second known time to cause the circuit device to go into saturation. At least one photon emitted by the circuit device in response to the stimulation is detected. The first photon increases the quantum efficiency of the superconducting hot-electron photodetector in detecting the at least one photon. The detection of the at least one photon relative to the first known time and the second known time is time correlated to temporally distinguish the first photon and the at least one photon and to temporally correlate the stimulation of the circuit device to the detection of the at least one photon.

In accordance with another aspect of the present invention, a method of examining a workpiece is provided that includes directing a plurality of photons at a superconducting hot-electron photodetector at corresponding known times. A transistor on the workpiece is stimulated at a second known time to cause the transistor to go into saturation. At least one photon emitted by the transistor in response to the stimulation is detected. The first photon increases the quantum efficiency of the superconducting hot-electron photodetector in detecting the at least one photon. The detection of the at least one photon relative to the first known time and the second known time is time correlated to temporally distinguish the first photon and the at least one photon and to temporally correlate the stimulation of the circuit device to the detection of the at least one photon.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
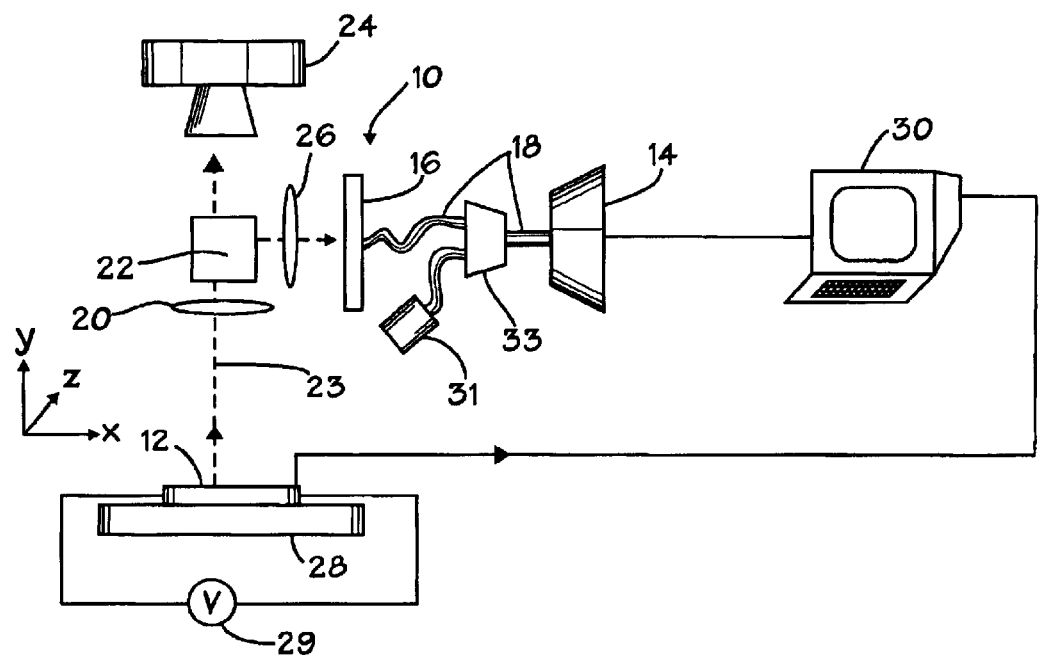
FIG. 1 is a schematic view of an exemplary imaging system suitable for obtaining hot electron photon images of a workpiece in accordance with the present invention.

In the drawings described below, reference numerals are generally repeated where identical elements appear in more than one figure. Turning now to the drawings, and in particular to FIG. 1, therein is shown a schematic view of an exemplary imaging system 10 suitable for obtaining hot electron photon images of a workpiece 12. The workpiece 12 may be a semiconductor wafer, a semiconductor-on-insulator wafer or virtually any other type of substrate useful for circuit fabrication.

The system 10 utilizes a superconducting hot-electron photodetector ("SHEP) 14 that is linked to an aperture 16 by a fiber optic cable 18. The SHEP 14 is advantageously operated in a superconducting state. Impacting photons cause the superconducting state to change to a non-superconducting state which is sensed as a sudden change in the resistivity of the SHEP 14. The dark count rate of the SHEP 14 may be less than about 10.0 counts per second.

The aperture 16 is placed in a back imaging plane of an objective lens 20. A beam splitter 22 sends a portion, for example 10%, of the light 23 emitted by the workpiece 12 to a navigation camera 24, while the remaining portion, for example 90%, is focused on the aperture 16 by a tube lens 26.

The system 10 may be used in single or multi-point probing techniques. In the single point approach, an individual circuit device on the workpiece 12 is selected using the aperture 16. The aperture 16 serves to "mask off" light from unwanted portions of the workpiece 12 and transmit light from the desired portion(s). For example, in a single point probe, the aperture 16 serves to "Mask off" light from unwanted circuit devices and transmit light from a desired circuit device. In multi-point probing, a larger area is targeted by the aperture 16. The size and shape of the aperture 16 can be varied to match different device and/or area devices.

Alignment of the aperture 16 and a particular spot on the workpiece 12 can be accomplished by first disconnecting the cable 18 from the SHEP 14 and then sending light back through the cable 18 and focusing the light spot on the targeted area of the workpiece 12. The projected image of the aperture will be clearly visible in the navigation camera image 24.

The aperture spot position remains fixed with reference to the image. The workpiece 12 is mounted on an x-y-z stage 28 and maybe physically moved to place the desired portion of the workpiece 12 under the aperture viewing location. The field of view (FOV) of the image, and hence the viewing area of the aperture 16, can also be adjusted using different magnification lenses.

The workpiece 12 is electrically connected to a power source 29, which selectively places one or more circuit devices of the workpiece 12 in a condition conducive to hot-electron photon emission. Examples of such conditions include placing a circuit device in saturation that may or may not coincide with the change in logic state of the device. Examples of such changes in logic state might include the switching of a MOS transistor device. Other examples will include leakage current across a junction or a gate dielectric film. The power supply 14 may include an oscillator to clock the circuit devices of the workpiece 12 in the event there is no onboard clock on the workpiece 12.

Data acquisition from the SHEP 14, the workpiece 12, as well the movements of the stage 28 and the operation of the power supply 29 maybe accomplished by a controller 30. The controller 30 is advantageously a computer or other programmable system linked to the stage 28 and the power supply 14.

A radiation source 31 is provided to emit one or more photons. The photons emitted from the radiation source 31 are directed to the SHEP 14 at known times in order to prime the SHEP 14 as described more fully below. The radiation source 31 is provided with a fiber optic cable 32 that is joined to the fiber optic cable 18 by way of a junction 33 that may be of any well-known design. The radiation source 31 may be any number of photon sources, such as, for example, light emitting diodes, lasers, semi-coherent lamps or the like. The capability to deliver single photons is desirable. The wave length of radiation emitted by the radiation source 31 is largely a matter of design discretion. However, the frequency of the radiation emitted by the radiation source 31 should be compatible with the SHEP 14.

Figure 2:
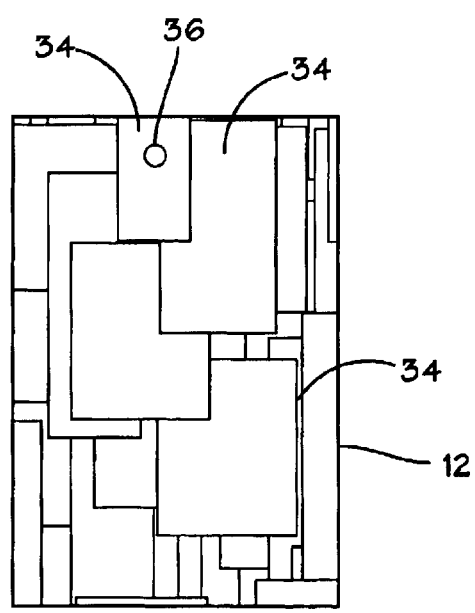
FIG. 2 is a plan view of a portion of the workpiece of FIG. 1 in accordance with the present invention.

The basic operation of the system 10 will now be described in conjunction with FIG. 1, and FIG. 2, which is a plan view of a portion of the workpiece 12. The workpiece 12 includes numerous circuit structures 34, represented schematically by the various rectangular structures in FIG. 2. The circuit structures 34 may be any of a myriad of different types of circuit devices used in integrated circuit fabrication, such as, for example, transistors, capacitors, diodes, inverters, nodes, macro cells, memory cells, or buses to name just a few. The stage 28 is positioned appropriately so that the aperture 16 is focused on a targeted area of interest, represented by the small circle 36 in FIG. 2. This targeted area of interest or field of view 36 may incorporate a single circuit device, such as, for example, a single transistor or transistor pair or a plurality of circuit devices as desired. Assume for the purposes of this illustration, that the field of view 36 encompasses a CMOS inverter that consists of at least one n-channel transistor and at least one p-channel transistor tied together. With the workpiece 12 appropriately positioned so that the field of view 36 encompasses the CMOS transistor pair, the power supply 29 is activated to cause the CMOS transistor pair to switch logic states one or more times and thereby go into saturation for transient periods. The entry into saturation by the transistor pair will likely cause the emission of one or more hot-electron induced photons that will likely be detected by the SHEP 14. The detected photons will be indicative of the actual switching of the CMOS transistor pair.

As noted above in the Background section hereof, the quantum efficiency of the SHEP 14 may be less than 100%. This lack of sensitivity may lead to lengthy data acquisition times and the inability to detect at all certain switching events depending upon the characteristics of the circuit device 34 and the uncertainties in the behavior of the SHEP 14. To enhance the effectiveness of the SHEP 14, the SHEP 14 may be primed with one or more photons of known physical and temporal origin.

Figure 3:
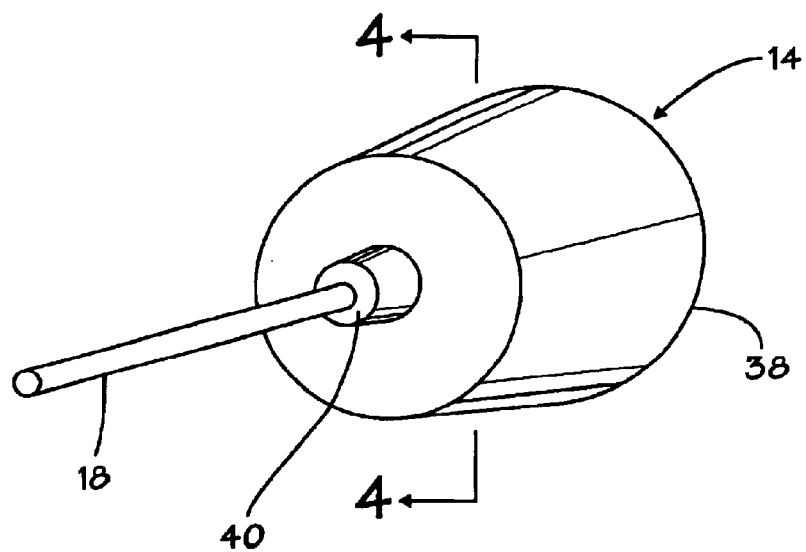
FIG. 3 is a pictorial view of an exemplary hot-electron photodetector used in the imaging system of FIG. 1 in accordance with the present invention.
Figure 4:
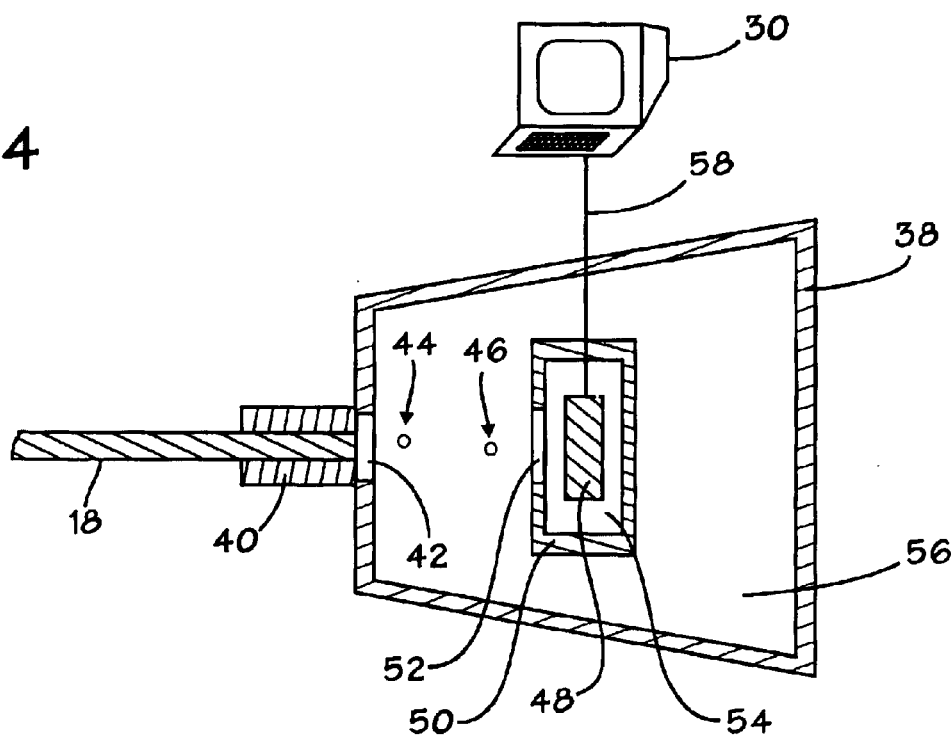
FIG. 4 is a cross-sectional view of FIG. 3 taken at section 4—4 in accordance with the present invention.

The process of priming the SHEP 14 will now be described in conjunction with FIGS. 1, 2, 3 and 4. FIG. 3 is an enlarged pictorial view of the SHEP 14 and FIG. 4 is a cross-sectional view of FIG. 3 taken at section 4—4. The SHEP 14 consists of a housing 38 to which the fiber optic cable 18 is joined byway of a coupling 40. The coupling may be of any well-known design. As shown in FIG. 4, the housing 38 includes a window 42 to enable photons to pass from the fiber optic cable 18 into the interior of the housing 38. The window 42 may be fabricated from quartz, or other suitable optical media. Two photons 44 and 46 are shown passing through the window 42 from the fiber optic cable 18 and speeding toward a superconducting hot-electron photodetector element 48. The window 42 may be configured with a built-in collimating lense property in order to focus the two photons 44 and 46 on the SHEP element 48. Optionally, a separate focusing lense may be provided. The SHEP element 48 may be separately enclosed within another enclosure 50 that is provided with another window 52 that may be similarly configured as the window 42. The enclosure 50 holds a volume of liquified gas, such as helium, 54 in order to maintain the photo detector element 48 below the superconducting transition temperature $T_C$. The enclosure 50 itself may, in turn, be surrounded by a volume of another liquified gas 56, which may be the same as the liquified gas 54 or another type of gas, such as, for example, liquid nitrogen. The need for and makeup of the cooling liquids 54 and 56 will depend upon the superconducting transition temperature $T_C$ of the photo detector element 48. The skilled artisan will appreciate that if the superconducting transition temperature of the SHEP element 48 is high enough, then the requirements for extreme cooling may be relaxed.

The superconducting element 48 is advantageously composed of a material that may be brought out of the superconducting state, at least in localized areas, by the impact of a photon. Exemplary materials include, for example, niobium nitride (NBN), YBCO ($YBa_2Cu_3O_{7-x}$) or the like. The element 48 may be entirely composed of the foregoing superconducting materials or be composed of thin films thereof fashioned on a substrate of suitable materials, such as, quartz or other relatively inert materials. The condition of the SHEP element 48, and particularly the resistivity thereof, is sensed by the controller 30 by way of a communications channel 58.

In order to increase the quantum efficiency of the SHEP element 48, at least one and possibly several priming photons 46 are directed to the photo detecting element 48 by way of the radiation source 31 shown in FIG. 1. For simplicity of illustration, the following description will focus on a single priming photon 46. The stage 28 is appropriately operated so that the field of view 36 is focused on the circuit device 34. At this point, the power source 14 is activated to begin stimulating the circuit device 34. This may entail, for example, clocking the circuit device 34 through some number of cycles that is largely a matter of design discretion. A short time after the stimulation of the circuit device 34 is commenced, the radiation source 31 is activated to emit the priming photon 46. This is done at a known point in time so that the priming photon 46 may be distinguished temporally from other photons that may be emitted from the circuit device 34. The delay after commencement of the stimulation of the circuit device 34 until the primary photon 46 is emitted may be on the order of a few picoseconds, more or less, depending upon the switching speed of the circuit device 34. When the priming photon 46 strikes the SHEP element 48, there is a probability that the SHEP 48 will come out of a superconducting state This change will produce a change in resistivity that is sensed by the controller 30. This change is also timed correlated.

As a result of the stimulation of the circuit device 34, it is anticipated that one or more hot-electron induced photons, will be emitted. Again, for simplicity of illustration, it is assumed that a single hot-electron induced photon 44 is emitted from the circuit device 34. When this photon 44 strikes the SHEP element 48, there is a much greater likelihood that the impact will produce a loss of superconductivity in the SHEP element 48 and thus a detectable impact than there would be in the absence of the priming photon 46. It is anticipated that the impacts of both the priming photon 46 and the hot-electron induced photon 44 will increase the probability that sufficient energy is imparted to the lattice of the SHEP element 48 to ensure that Cooper pairs are broken and a cessation of superconductivity ensues in at least a portion of the SHEP element 48.

The mechanisms behind the loss of superconductivity in a SHEP due to photon absorption are not entirely understood. However, it is believed that upon absorption of a light quantum by either a normal electron or a Cooper pair, a highly excited electron, with energy close to the incident photon energy is created. Due to the large physical size of a Cooper pair, only one electron absorbs a photon, while the second one becomes a low energy quasiparticle. Next, the excited (very hot) electron starts to lose its energy via electron-electron scattering and creation of secondary excited electrons. The loss of energy occurs extremely rapidly, on the order of less than 1.0 ps. The excited electrons emit Debye phonons whose mean-free path is very small. The phonons, in turn, excite additional electrons causing additional Cooper pairs to break. All of these interactions cause a momentary rise in the temperature of the photodetector above the superconducting transition temperature and a loss of superconductivity.

The detection of the photons 44 and 46 are timed correlated so that the photon 44 is temporally distinguished from the priming photon 46 and so that the detection of the photon 44 is timed correlated to the stimulation of the circuit device 34. Thus, the switching behavior of the circuit devices 34 on the workpiece 12 may be investigated non-invasively with the promise of greater quantum efficiency.

The technique may be used to image not only a front side but also a back side of the workpiece 12. This may be advantageous in circumstances where backside imaging is desired in order to non-invasively probe circuit elements of the workpiece 12 that are buried deep within various strata.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of examining a workpiece, comprising:
   directing a first photon at a photodetector at a first known time;
   stimulating a circuit device of the workpiece at a second known time to produce a condition in the circuit device conducive to photon emission;
   detecting at least one photon emitted by the circuit device in response to the stimulation, the first photon increasing the quantum efficiency of the photodetector in detecting the at least one photon; and time correlating the detection of the at least one photon relative to the first known time and the second known time to temporally distinguish the first photon and the at least one photon and temporally correlate the stimulation of the circuit device to the detection of the at least one photon.

2. The method of claim 1, wherein the directing a first photon comprises generating the first photon with a light emitting diode.

3. The method of claim 2, wherein the first photon is transmitted through a fiber-optic cable.

4. The method of claim 1, wherein the photodetector comprises a material in a superconducting state.

5. The method of claim 4, wherein the material comprises niobium nitride.

6. The method of claim 1, wherein the stimulating the circuit device comprises causing the circuit device to change logic states.

7. The method of claim 1, wherein the stimulating the circuit device comprises placing the circuit device in saturation.

8. The method of claim 1, wherein the circuit device comprises a transistor.

9. The method of claim 8, wherein the stimulating of the transistor comprises the switching the transistor.

10. The method of claim 1, wherein the workpiece comprises a semiconductor substrate.

11. The method of claim 2, wherein the semiconductor substrate comprises a front side and a backside, the at least one photon being emitted from the backside.

12. A method of examining a workpiece, comprising:

directing a first photon at a superconducting hot electron photodetector at a first known time;

stimulating a circuit device of the workpiece at a second known time to cause the circuit device to go into saturation;

detecting at least one photon emitted by the circuit device in response to the stimulation, the first photon increasing the quantum efficiency of the superconducting hot electron photodetector in detecting the at least one photon; and time correlating the detection of the at least one photon relative to the first known time and the second known time to temporally distinguish the first photon and the at least one photon and temporally correlate the stimulation of the circuit device to the detection of the at least one photon.

13. The method of claim 12, wherein the directing a first photon comprises generating the first photon with a light emitting diode.

14. The method of claim 13, wherein the first photon is transmitted through a fiber-optic cable.

15. The method of claim 12, wherein the superconducting hot-electron photodetector comprises niobium nitride.

16. The method of claim 12, wherein the stimulating the circuit device comprises causing the circuit device to change logic states.

17. The method of claim 12, wherein the circuit device comprises a transistor.

18. The method of claim 12, wherein the workpiece comprises a semiconductor substrate.

19. The method of claim 12, wherein the workpiece comprises a semiconductor-on-insulator substrate.

20. The method of claim 12, wherein the semiconductor substrate comprises a front side and a backside, the at least one photon being emitted from the backside.

21. A method of examining a workpiece, comprising:

directing a plurality of photons at a superconducting hot electron photodetector at corresponding known times;

stimulating a transistor on the workpiece at a second known time to cause the transistor to go into saturation;

detecting at least one photon emitted by the transistor in response to the stimulation, the first photon increasing the quantum efficiency of the superconducting hot electron photodetector in detecting the at least one photon; and time correlating the detection of the at least one photon relative to the first known time and the second known time to temporally distinguish the first photon and the at least one photon and temporally correlate the stimulation of the circuit device to the detection of the at least one photon.

22. The method of claim 21, wherein directing a plurality of photons comprises generating the plurality of photons with a light emitting diode.

23. The method of claim 22, wherein the plurality of photons are transmitted through a fiber-optic cable.

24. The method of claim 21, wherein the superconducting hot-electron photodetector comprises niobium nitride.

25. The method of claim 21, wherein the stimulating the circuit device comprises causing the circuit device to change logic states.

26. The method of claim 21, wherein the workpiece comprises a semiconductor substrate.

27. The method of claim 21, wherein the workpiece comprises a semiconductor-on-insulator substrate.

28. The method of claim 21, wherein the semiconductor substrate comprises a front side and a backside, the at least one photon being emitted from the backside.

* * * * *

UNITED STATES PATENT AND TRADEMARK OFFICE
CERTIFICATE OF CORRECTION

PATENT NO. : 6,828,809 B1
APPLICATION NO. : 10/324324
DATED : December 7, 2004
INVENTOR(S) : Michael R. Bruce et al.

It is certified that error appears in the above-identified patent and that said Letters Patent is hereby corrected as shown below:

In column 3, line 63, delete "maybe" and substitute --may be-- therefor;

In column 4, line 15, delete "maybe" and substitute --may be-- therefor;

In column 5, line 8, delete "byway" and substitute --by way-- therefor;

In column 6, line 38, delete "are46" and substitute --are 46-- therefor;

In column 8, claim 21, line 25, delete "first photon" and substitute --plurality of photons-- therefor; and In column 8, claim 21, line 32, delete "first photon" and substitute --plurality of photons-- therefor.

Signed and Sealed this

Thirtieth Day of January, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,828,809 B1 |
| APPLICATION NO. | : 10/324324 |
| DATED | : December 7, 2004 |
| INVENTOR(S) | : Michael R. Bruce et al. |

It is certified that error appears in the above-identified patent and that said Letters Patent is hereby corrected as shown below:

In column 3, line 63, delete "maybe" and substitute --may be-- therefor;

In column 4, line 15, delete "maybe" and substitute --may be-- therefor;

In column 5, line 8, delete "byway" and substitute --by way-- therefor;

In column 6, line 38, delete "are46" and substitute --are 46-- therefor;

Signed and Sealed this

Thirteenth Day of March, 2007

JON W. DUDAS
*Director of the United States Patent and Trademark Office*